United States Patent
Jammu et al.

(10) Patent No.: US 7,490,473 B2
(45) Date of Patent: Feb. 17, 2009

(54) SYSTEM AND METHOD FOR PREDICTING COMPONENT FAILURES IN MAGNETIC RESONANCE IMAGING MACHINE

(75) Inventors: Vinay Bhaskar Jammu, Bangalore (IN); Abhay Sudhakar Rao Kant, Bangalore (IN); Krishna Vardhan Pullatikurti, Bangalore (IN)

(73) Assignee: General Electric Company, Niskayuna, NY (US)

( * ) Notice: Subject to any disclaimer, the term of this patent is extended or adjusted under 35 U.S.C. 154(b) by 446 days.

(21) Appl. No.: 11/094,908

(22) Filed: Mar. 31, 2005

(65) Prior Publication Data

US 2006/0225433 A1 Oct. 12, 2006

(51) Int. Cl.
*F25B 9/00* (2006.01)
(52) U.S. Cl. .......................................... 62/6
(58) Field of Classification Search ................ 62/6
See application file for complete search history.

(56) References Cited

U.S. PATENT DOCUMENTS

| | | | |
|---|---|---|---|
| 5,018,357 A * | 5/1991 | Livingstone et al. | 62/6 |
| 5,032,772 A * | 7/1991 | Gully et al. | 318/135 |
| 6,233,947 B1 * | 5/2001 | Madni et al. | 62/6 |
| 6,289,680 B1 * | 9/2001 | Oh et al. | 62/6 |
| 6,774,632 B2 | 8/2004 | Kono | 324/318 |
| 6,883,333 B2 * | 4/2005 | Shearer et al. | 62/6 |
| 2003/0052681 A1 * | 3/2003 | Kono | 324/318 |
| 2004/0119434 A1 * | 6/2004 | Dadd | 318/490 |
| 2005/0109049 A1 * | 5/2005 | Chan | 62/129 |
| 2006/0111857 A1 * | 5/2006 | Shah et al. | 702/85 |

OTHER PUBLICATIONS

Takashi Inaguchi, Masashi Nagao & Hideto Yoshimura; "Effect of Regenerator on Gifford-McMahon Cycle Cryocooler Operating At About 4 K"; Advances In Cryogenic Engineering, vol. 35; Edited by R. W. Fast; Plenum Press New York, 1990; pp. 1271,1273,1275.

M. Thirumaleshwar & R. M. Pandey; "Two stage Gifford-McMahon cycle cryorefrigerator operated by gas balancing principle"; Cryogenics 1990 vol. 30 February; pp. 100-104.

M. Thirumaleshwar & S.V. Subramanyam; "Exergy analysis of a Gifford-McMahon cycle cryorefrigerator"; Cryogenics 1986 vol. 26 April; pp. 248-250.

* cited by examiner

*Primary Examiner*—William C Doerrler
(74) *Attorney, Agent, or Firm*—Fletcher Yoder

(57) ABSTRACT

The method includes obtaining input data representative of a first parameter of a cryogenic medium in a cryogenic cooling system is provided. The method further includes calculating an expected value representative of a second parameter of the cryogenic medium in the cooling system via a predefined physics based model. A second input data representative of the second parameter of the cryogenic medium in the cooling system is estimated. The expected value is compared to the second input data and difference between the expected value and the second input data is correlated to statistical data to estimate a likelihood of cryogenic cooling system event.

16 Claims, 7 Drawing Sheets

SYSTEM AND METHOD FOR PREDICTING COMPONENT FAILURES IN MAGNETIC RESONANCE IMAGING MACHINE

BACKGROUND

The present invention relates generally to prediction systems and, more particularly, to methods and systems for predicting component failures in imaging devices.

Imaging devices, such as magnetic resonance imaging (MRI) devices, are typically used to diagnose patients in medical environments. The generated magnetic resonance image is a map of weak magnetization originated from the atomic nuclei in the body tissue as influenced by presence of an external magnetic field. By detecting these influences, MRI devices produce detailed images of a patient's internal tissues and organs, thereby enabling diagnosis of disease, injuries, among other physiological conditions of a patient.

Typically, an MRI device includes a magnetic system disposed about a patient-receiving cavity. Such magnetic systems include a superconductive electromagnet that generates a static magnetic field, a plurality of gradient coils that effectuate gradient magnetic fields, and an RF coil that generates a high frequency magnetic field for exciting the atomic nuclei within the patient.

In traditional MRI systems, the superconductive electromagnet has a number of loops of coiled wire that are bathed in a cryogenic fluid, such as liquid helium. This cryogenic fluid cools the coiled wire to extremely low temperatures, maintaining the magnet in a superconducting state. Thermal insulating material and other heat transfer barriers, such as vacuum regions, are often provided to insulate the magnet and cryogenic fluid, to impede heat transfer between the magnet and the environment. To conserve cryogen, MRI devices generally include a cryogenic cooling system, which enables recondensation of volatilized cryogenic fluid back to a liquid phase.

In medical environments, customers often demand high availability of MRI devices. However, the cryogenic cooling system may require periodic maintenance, such as repair or replacement. Indeed, the performance of the cooling system components may degrade due to wear, thereby reducing its efficiency. Moreover leakage of cryogen from the magnet system may also reduce the efficiency of the cooling system.

However, repair of MRI devices is often a reactive process. That is, repair is not initiated until a malfunction, for example, has materialized. This can lead to unwanted downtime at the most inopportune moments. Such downtime can lead to loss of customers and increased repair costs.

Therefore, there is need for a method and system for enabling incipient failure detection and predicting time-to-failure of an MRI device.

BRIEF DESCRIPTION

In accordance with one aspect of the present technique, a method of estimating a cryogenic cooling system event is provided. The exemplary method includes obtaining input data representative of a first parameter of a cryogenic medium in a cryogenic cooling system. The method further includes calculating an expected value representative of a second parameter of the cryogenic medium in the cooling system via a predefined physics based model. A second input data representative of the second parameter of the cryogenic medium in the cooling system is estimated. The expected value is compared to the second input data and difference between the expected value and the second input data is correlated to statistical data to estimate a likelihood of a cryogenic cooling system event.

In accordance with another aspect of the present technique, an exemplary failure detection system for a cryogenic cooling system event is provided. The detection system includes a first sensor configured to detect a value representative of a first parameter of a cryogenic medium in the cryogenic cooling system. A second sensor is configured to detect a value representative of a second parameter of the cryogenic medium in the cryogenic cooling system. Monitoring circuitry is configured to calculate an expected value representative of the second parameter of the cryogenic medium in the cooling system using a predefined physics based relationship. The difference between the expected value and the actual value representative of the second parameter is correlated to a predetermined statistical data to determine a likelihood of failure and time-to-failure of the cooling system.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
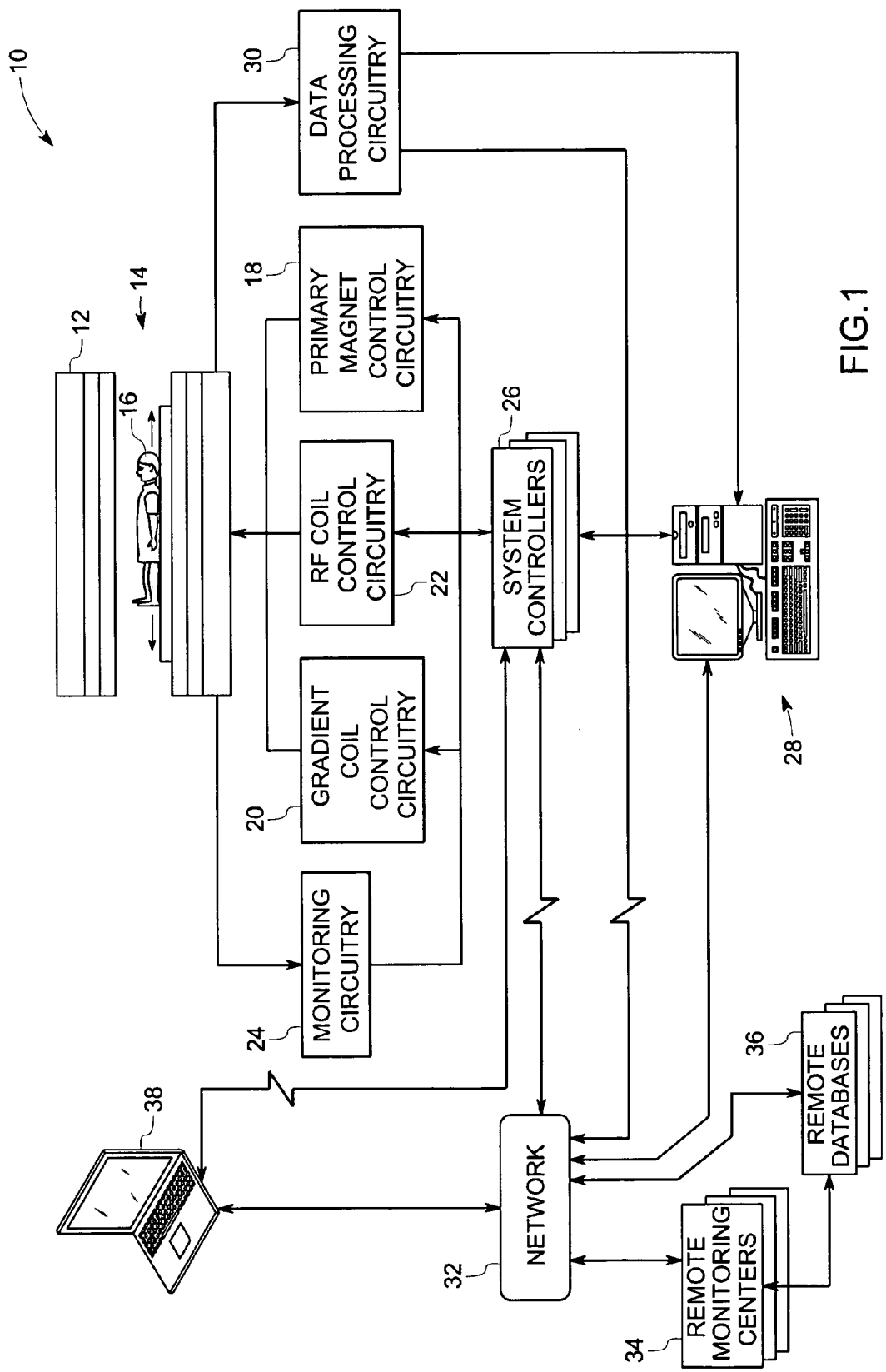
FIG. 1 is a diagrammatical representation of an imaging network, in accordance with an exemplary embodiment of the present technique.

FIG. 1 illustrates an exemplary imaging network 10. The illustrated imaging network 10 is described with respect to a medical imaging device, such as a magnetic resonance imaging (MRI) device or a nuclear magnetic resonance imaging device. It should be noted that the present technique may be applied to any appropriate device that employs a cryogen cooling system, such as aircraft engines, spectroscopy systems, power transmission systems, nuclear reactors, biological cooling facilities, or the like.

The illustrated imaging network 10 includes a (MRI) scanner 12. The scanner 12 includes a cavity 14 for receiving a patient 16 for obtaining a diagnostic image of the patient. A superconductive electromagnet (shown in FIG. 2) is disposed in the cavity 14 for generating a magnetic field in the cavity 14. Although, in the illustrated embodiment, a superconductive electromagnet is provided, permanent magnets, electromagnets, or a combination of these may be used. The cavity 14 may be a horizontal cylindrical cavity, or a cavity of various other configurations.

As appreciated by those of ordinary skilled in the art, the MRI scanner 12 includes gradient coils, radio frequency (rf) coils (not shown) for controlling the magnetic field generated in the cavity 14. In the illustrated embodiment, the superconductive electromagnet, the gradient coils, and the rf coils are controlled by primary magnet control circuitry 18, gradient control circuitry 20, and rf coil control circuitry 22, respectively. The various other operations and conditions of the scanner 12 are monitored by monitoring circuitry 24. In other embodiments, the operation of the scanner 12 may be controlled by any number of suitable circuits and/or devices.

In the illustrated embodiment, the above-mentioned control circuits are under the direction of at least one system controller 26. As appreciated by those skilled in the art, the system controller 26 may include a range of circuitry types, such as a microprocessor, a programmable logic controller, a logic module, or the like. The system controller 26 may also include memory devices for storing program routines, image data, configuration parameters, or the like. The system controller 26 may be coupled to a user interface 28 such as a computer terminal, or the like. The user interface 28 facilitates receiving of the information and also input of commands to the scanner 12.

The scanner 12 is coupled to a data processing circuitry 30 provided to receive detected image signals and process these signals to obtain data for generating the image. The image data may be transmitted to the user interface 28 for viewing or to a remote location for storage. The user interface 28 may also be used to perform functions, such image enhancement, intensity adjustment, or the like. The MRI scanner 12 is coupled to remote locations and/or devices via a network 32. Communication through the network 32 is transmitted in accordance with a communication protocol, such as a cellular protocol, a wireless protocol, a radio frequency protocol, or a combination thereof. Of course, those of ordinary skilled in the art will appreciate that any number of suitable communication protocols can be employed. In the illustrated embodiment, the imaging network 10 includes a remote monitoring center 34 that receives data related to operation of the scanner 12 and image data from the MRI scanner 12 via the network 32. The network 32 facilitates access to a remote database 36. The remote database 36 may store large volumes of image data and operation data from a variety of sources in the imaging network 10. Image or operating data is accessed by user interfaces 28 at locations remote from the imaging scanner 12.

A field unit 38, such as a laptop computer or hand-held device may be coupled to the system controller 26. The exemplary field unit 38 is configured to access data or operating parameters from the MRI scanner 12. The field unit 38 is used to monitor the operations of the MRI scanner 12 and provide system adjustments in response, to improve the quality of the images generated.

Figure 2:
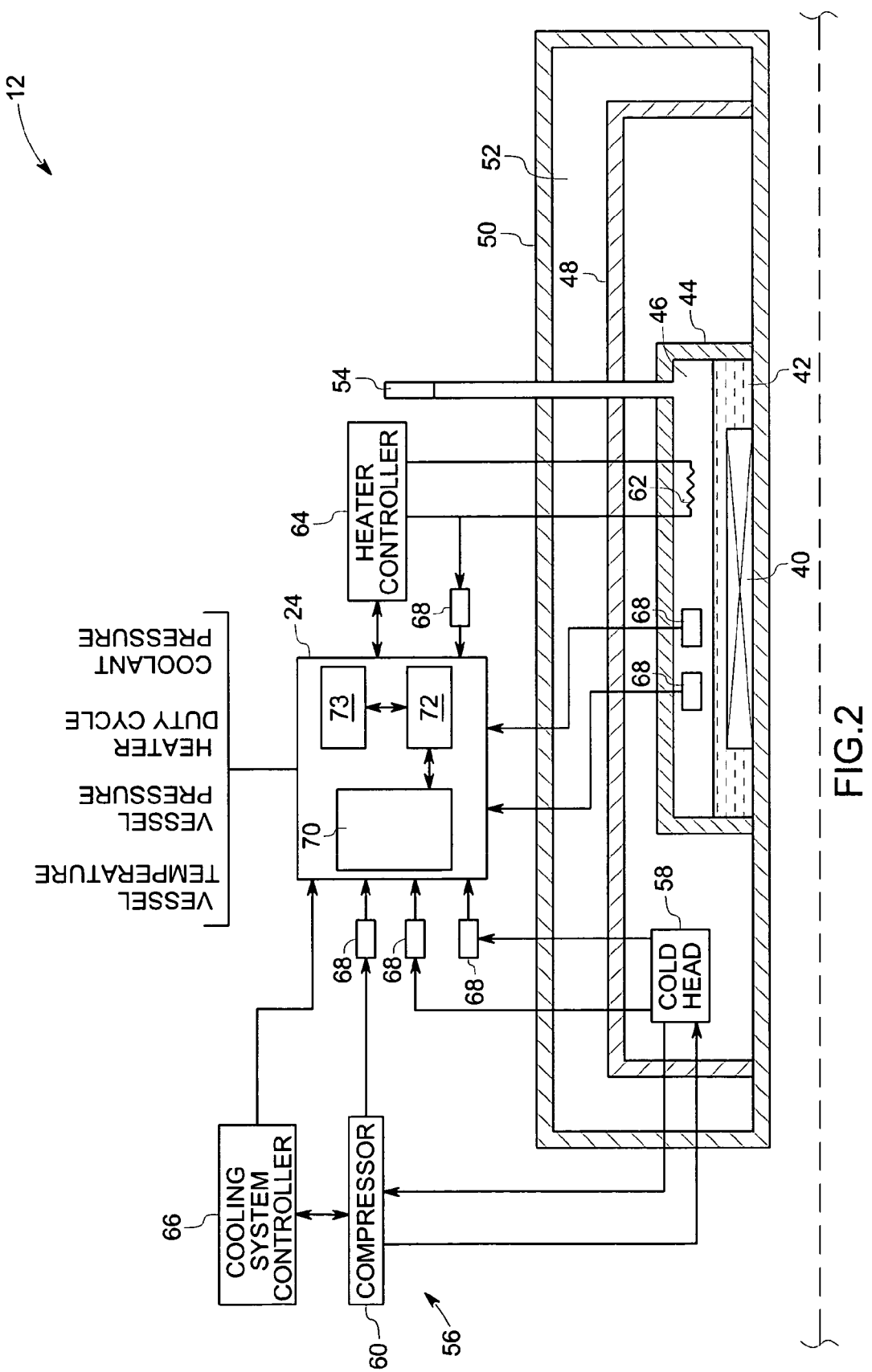
FIG. 2 is a partial cross-sectional view of a cryogenically cooled imaging device, in accordance with an exemplary embodiment of the present technique.

Referring to FIG. 2, the MRI scanner 12 includes a superconductive magnet 40 disposed circumferentially about the cavity 14. The superconductive magnet 40 includes loops of coiled wire through which current is transmitted to generate a magnetic field. The electromagnet 40 may be cooled to a superconductive state to reduce the electrical load required to generate the desired magnetic field in the cavity 14. The electromagnet 40 is immersed in a cryogenic medium 42, such as liquid helium filled inside a vessel 44 circumscribing the cavity 14. At low temperatures such as 4 Kelvin, the electromagnet 40 conducts electric current without electric resistance. A relatively strong magnetic field of the magnitude of 0.5 to 2 Tesla may be generated at lesser electrical loads, thereby reducing the operating costs.

Liquid helium 42 volatilizes into gaseous helium 46 at relatively low temperatures. In the illustrated embodiment, the vessel 44 is surrounded by a radiation heat shield 48 to insulate the liquid helium 42 and gaseous helium 46 from external heat sources. An outer housing 50 is formed surrounding the radiation heat shield 48. A vacuum space 52 is formed between the radiation heat shield 48 and the vessel 44 and also between the heat shield 48 and the outer housing 50.

In the illustrated embodiment, the vessel 44 is coupled to a relief valve 54. If the pressure inside the vessel 44 exceeds a desired operating pressure due to vaporization of liquid helium 42, the relief valve 54 releases excess gaseous helium 46, relieving the pressure. A cryogenic cooling system 56 is provided to recondense gaseous helium 46, to liquid helium 42, thereby conserving helium. The cryogenic cooling system 56 includes a cold head 58 coupled to a compressor 60. The cooling of the cold head 58 is described in greater detail below.

The pressure within the vessel 44 is maintained within predetermined limits during operation of the scanner 12. If equilibrium in the vessel is biased towards the liquid phase of helium, a negative pressure is generated in the vessel 44, allowing atmospheric air to enter into the vessel 44. This may result in clogging of the cooling system 56 leading to degradation and/or failure of the cooling system 56. A heating element 62 is provided inside the vessel 44 to heat the liquid helium 42 to increase the pressure inside the vessel 44. A heater controller 64 is provided to control power to the heating element 62, based on pressure detected within the vessel 44. If the pressure in the vessel 44 is biased towards the gaseous phase, pressure in the vessel 44 increases, leading to venting of helium through the relief valve 54. In the illustrated embodiment, a cooling system controller 66 may adjust the operation of the cooling system 56, to reduce the pressure inside the vessel 44.

A plurality of sensors 68 are provided to monitor operation of the MRI scanner 12. In the illustrated embodiment, the sensors 68 are provided inside the vessel 44 to monitor the temperature and pressure of the vessel 44. Other sensors 68 may be provided to monitor the cooling components of the cooling system 56, such as cold head 58, and compressor 60. Yet other sensors 68 may be provided to monitor the heating components of the cryogen cooling system 56, such as heating element 62. The sensors 68 provide data relating to the operation of the scanner 12 to the monitoring circuitry 24. The cooling system controller 66 and the heater controller 64 may also provide data relating to the cooling system 56 to the monitoring circuitry 24. In the illustrated embodiment, data relating to pressure in the vessel 44, temperature in the vessel 44, heater duty cycle, coolant pressure, or the like may be communicated to the monitoring circuitry 24.

In the illustrated embodiment, the monitoring circuitry 24 further comprises an intermediate database 70 and an algorithm 72 as well as a processor 73. The intermediate database 70 is configured to store data relating to the operation of the scanner 12. The algorithm 72, in co-operation with the processor 73, is configured to perform various computational and processing operations of the data stored in the intermediate database 70. The circuitry 24 is configured to communicate processed data and the received data to the network 32 and the user interface 28.

Figure 3:
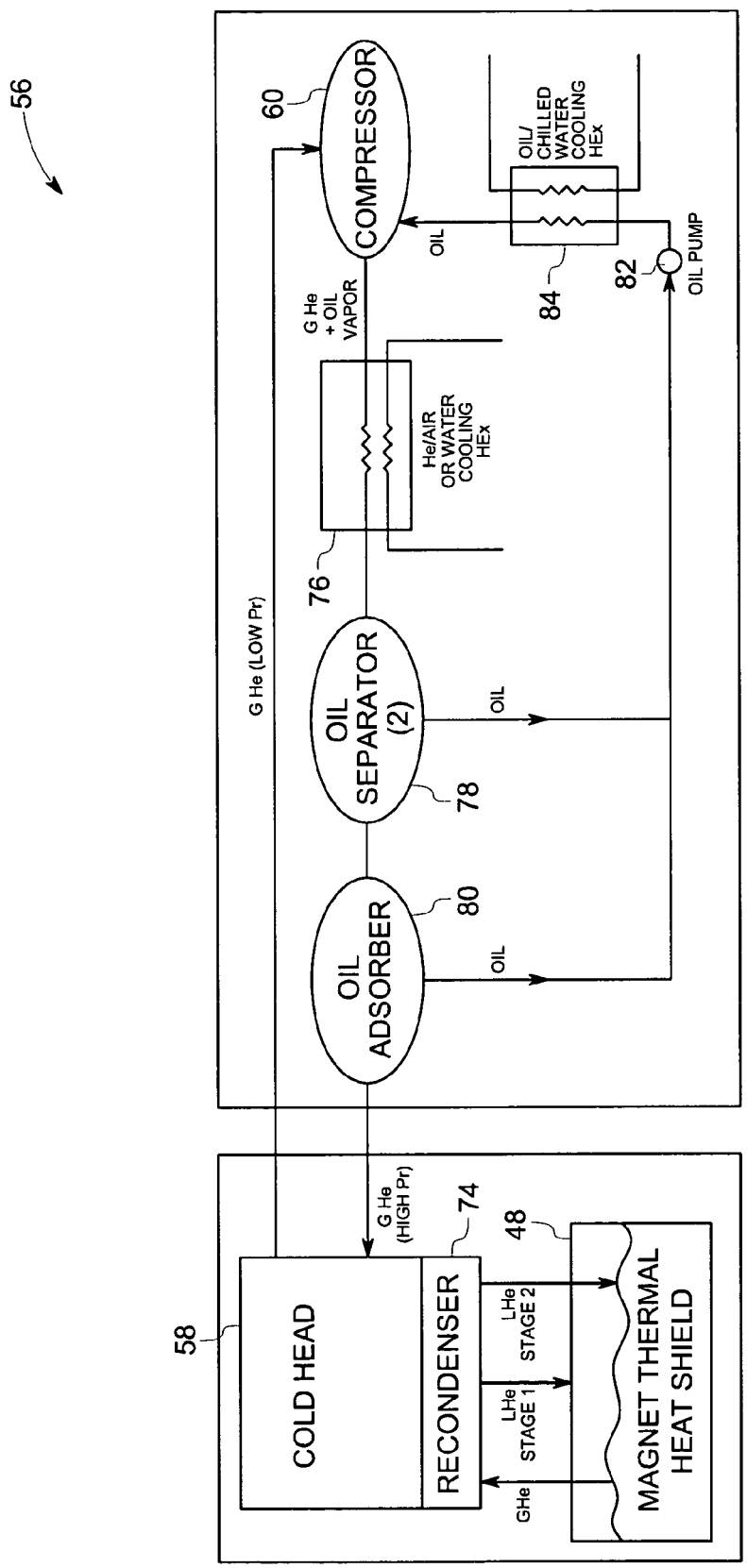
FIG. 3 is a diagrammatical representation of a cryogenically cooled imaging device employing a cooling circuit, in accordance with an exemplary embodiment of the present technique.

Referring to FIG. 3, the cooling system 56 of the scanner 12 is illustrated diagrammatically. As mentioned above, liquid cryogen volatilizes into gaseous cryogen at relatively low temperatures. The vessel 44 is surrounded by the radiation heat shield 48 to insulate the liquid cryogen and gaseous cryogen from external heat sources. The heating element 62 is configured to maintain the pressure inside the vessel 44 at a predetermined value. When the pressure inside the vessel 44 is reduced below the predetermined value, the heating element 62 is configured to heat the liquid cryogen until the pressure inside the vessel 44 reaches a predetermined value. A recondenser 74 is attached to the cold head 60. The recondenser 74 is configured to receive the gaseous cryogen and convert (i.e., condense) it to liquid cryogen.

In the illustrated embodiment, the gaseous cryogen is compressed in the compressor 60 to higher pressure and higher temperature. The gas at higher pressure and higher temperature is isobarically cooled via a heat exchanger 76. Thus, the pressure remains high, but the temperature is lowered. The gas at higher pressure and lower temperature from the heat exchanger 76, includes traces of oil. The gas is passed through the oil separator 78 to remove the traces of oil. The remaining amount of oil in the gas is absorbed by an oil absorber 80. The gas at higher pressure and lower temperature is fed to the cold head 58 where the gas is expanded and cooled. Thus, the pressure is reduced. The low pressure cryogenic gas is fed from the cold head 58 to the compressor 60. The separated oil is pumped by an oil pump 82 to the compressor 60 via a heat exchanger 84. The heat exchanger 84 is configured to cool the oil fed to the compressor 60. The cycle is repeated as mentioned above.

Figure 4:
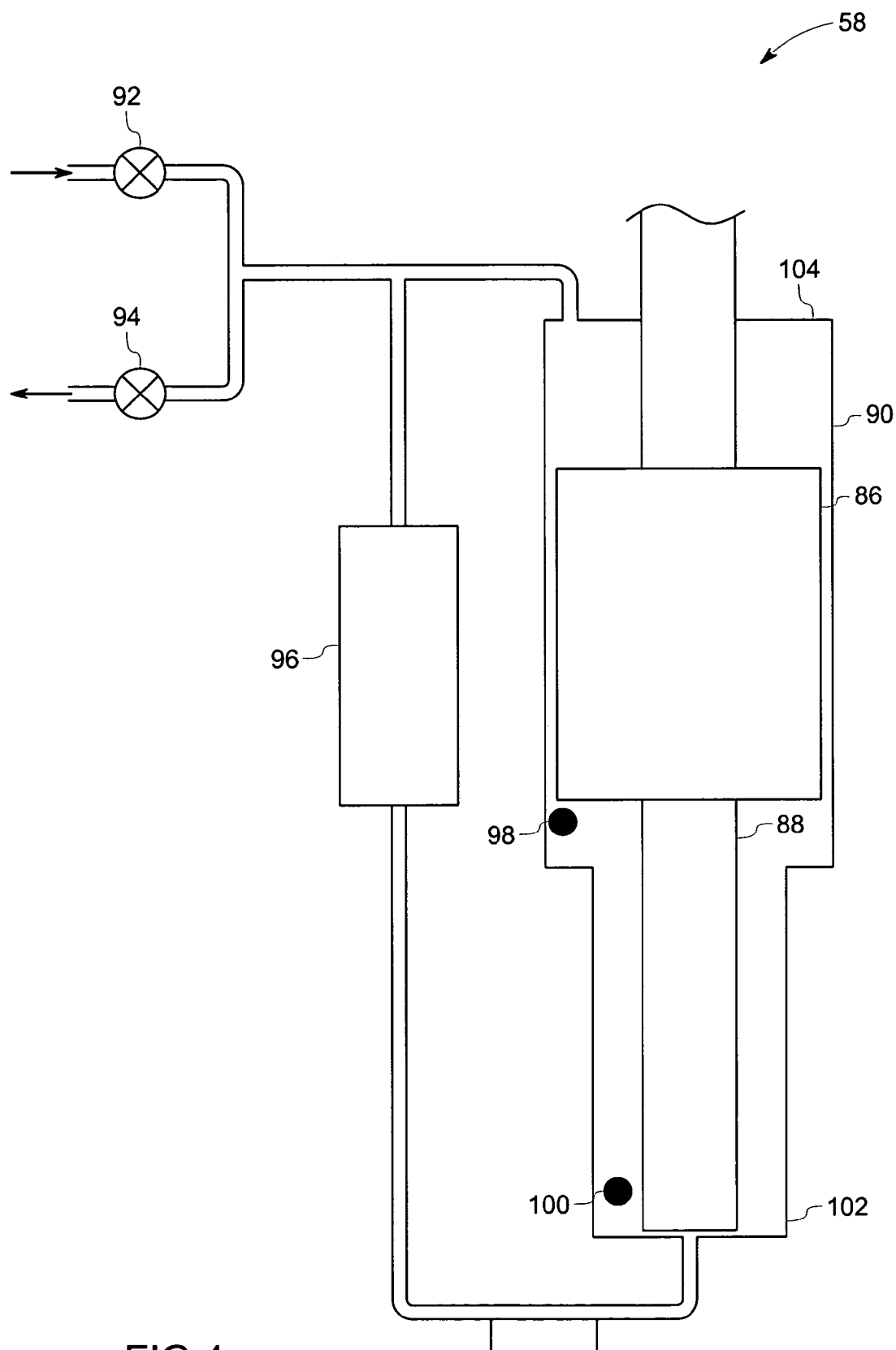
FIG. 4 is a diagrammatical representation of a cold head, in accordance with the embodiment of FIG. 3.

Referring to FIG. 4, cold head 58 includes a plurality of displacers 86, 88 provided inside a cylinder 90. As appreciated by those skilled in the art, the cold head 58 operates based on Gifford-McMahon principle. Compressed cryogenic gas is supplied to the cylinder 90 via an intake valve 92 and the expanded gas from the cylinder 90 is fed to the compressor 60 via an exhaust valve 94. The cold head 58 also includes a regenerator 96 configured to cool the cryogenic gas. In the illustrated embodiment, the cold head 58 is a two-stage Gifford-McMahon refrigerator. Two sensors 98, 100 are provided to detect first and second stage temperatures respectively of the cryogenic medium in the cold head 58. In one example, the first stage temperature is in the range of 25 to 40 Kelvin and the second stage temperature is in the range of 3.5 to 4.2 Kelvin.

During pressurization phase, the displacers 86, 88 are positioned at a cold end 102 of the cylinder 90, so that compressed cryogenic gas from the compressor 60 is supplied to a warm end 104 of the cylinder 90 via the intake valve 92. At intake phase, the intake valve 92 is maintained in open state and the displacers 86, 88 are moved towards the warm end 104 of the cylinder 90. The gas filled in the warm end 104 of the cylinder 90 is pushed through the regenerator 96 to the cold end 102 of the cylinder 90. During the expansion phase, the intake valve 92 is closed and the exhaust valve 94 is opened slowly, so that cooling of gas occurs at the cold end 102 of the cylinder 90. At exhaust phase, the displacers 86, 88 are moved towards the cold end 102 of the cylinder 90, so that cooled gas is pushed through the regenerator 96. The gas is fed through the exhaust valve 94 to the compressor 60. The exhaust valve 94 is closed and the cycle is repeated as mentioned above. Operation of this device in accordance with an exemplary cycle is discussed further below in relation to FIG. 5.

The MRI scanner 12 may require maintenance periodically due to variety of reasons. For example, cold head may fail due to degradation of sealing, image quality may deteriorate, clogging of filter, level of helium may reduce to low level, or the like. In such cases, the scanner 12 may require maintenance. The maintenance procedures may require shutting down of the scanner 12 leading to extensive downtime and cost. It is desirable to minimize the down time of the scanner 12.

As mentioned above, the sensors 68 may detect plurality of parameters related to operating conditions of the scanner 12. In the exemplary method, a plurality of physics based models may be used to correlate measured conditions of the cooling system 56 to a cooling system event such as a cold head failure. The physics based models may be used to correlate statistical data indicative of the measured condition of the cooling system 56 to the occurrence of a future cryogenic cooling system event. For instance, the physics based models correlate deviations of the cooling system's operating parameters from expected values with the likelihood of a certain cooling system event occurings. For example, the physics based models may be used to detect cold head failure based on the measured conditions of the cooling system 56. The physics based models are described in greater detail below with reference to subsequent figures.

In the illustrated example, the physics based models may be provided in the monitoring circuitry 24. The operator may access data related to operating condition of the scanner 12 via the network 32. However in other embodiments, the models may be located in the remote monitoring center 34. The models may also be located and accessed at the user interface 28 or system controller 26. The operator may schedule service and routine maintenance based on the accessed data.

The models may also be used to determine and rank the likelihood and severity of the cooling system events for assisting the operator in the maintenance of the scanner 12. In one example, the operator may address the likelihood of cold head failure over other events, to reduce downtime. The models may be used to estimate time interval until occurrence of cooling system event based on measured conditions of the cooling system 56 and also corresponding statistical data. The operator may perform proactive maintenance depending on the estimated time interval for the occurrence of the cooling system events. For example, the models may estimate that cold head is likely to fail in one month and that compressor is likely to fail in one and a half month. The operator may advance the maintenance schedule of the cold head prior to the predicted time interval to reduce down time. Accordingly, it may be advantageous to co-ordinate the schedules of routine maintenance and service maintenance.

Figure 5:
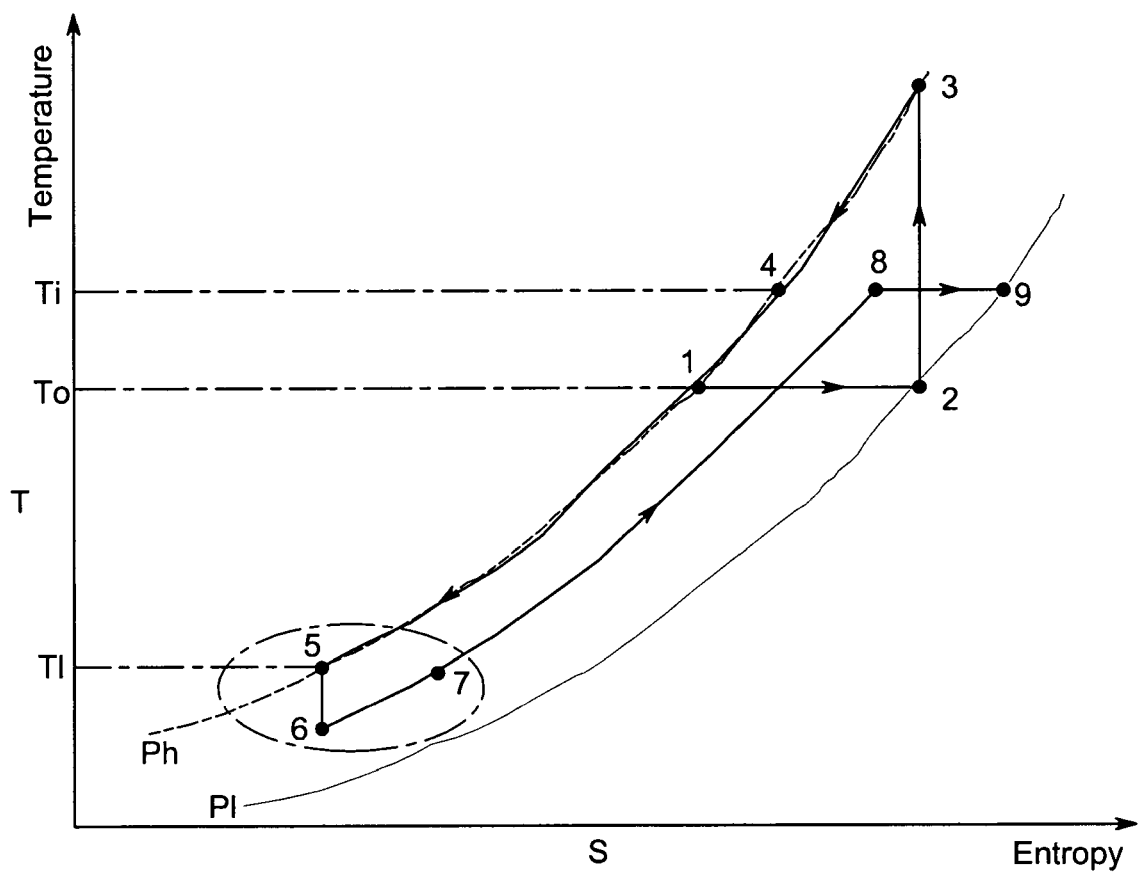
FIG. 5 is a graphical representation illustrating the Gifford-McMahon principle, in accordance with an exemplary embodiment of the present technique.

Keeping FIG. 4 in mind and referring generally to FIG. 5, a graphical illustration of a temperature versus entropy relationship representing the Gifford-McMahon principle is illustrated. Stage 1-2 represents isenthalpic expansion of cryogenic gas due to opening of intake valve 92. The temperature of the gas is maintained constant. The gas is fed to the warm end 104 of the cylinder 90. Stage 2-3 represents compression of gas inside the cylinder 90 due to movement of the displacers 86, 88 towards warm end 104 of the cylinder 90. The temperature of the gas is increased. The gas is pushed out from the warm end 104 of the cylinder 90. Stage 3-4 represents expansion of the gas, causing reduction in temperature and pressure of the gas. The gas is passed through the regenerator 96 causing cooling of the gas. Stage 4-5 represents cooling of the gas in the regenerator 96. The temperature of the gas is further reduced. The gas from the regenerator 96 is fed to the cold end 102 of the cylinder 90. Stage 5-6 represents adiabatic expansion of the gas fed from the regenerator 96. As appreciated by those skilled in the art, stage 5-6, represents second stage cooling of the cryogenic medium due to the joule thompson effect. Stage 6-7 represents cooling of gas due to refrigeration load. The gas is pushed out from the cold end 102 of the cylinder 90 when the displacer 86, 88 is moved towards the cold end 102 of the cylinder 90. The gas is moved through the regenerator 96 so that heating of gas occurs at the regenerator 96. Stage 7-8 represents the heating of gas in the regenerator 96. The temperature of gas is increased due to the heating. The gas from the regenerator 96 is pushed out through the exhaust valve 94 to the compressor 60. Stage 8-9 represents isenthalpic expansion of gas due to displacement of gas through the exhaust valve 94. Thus, if one knows the physical changes in the system, one can calculate expected values along the graph, in the given system.

Figure 6:
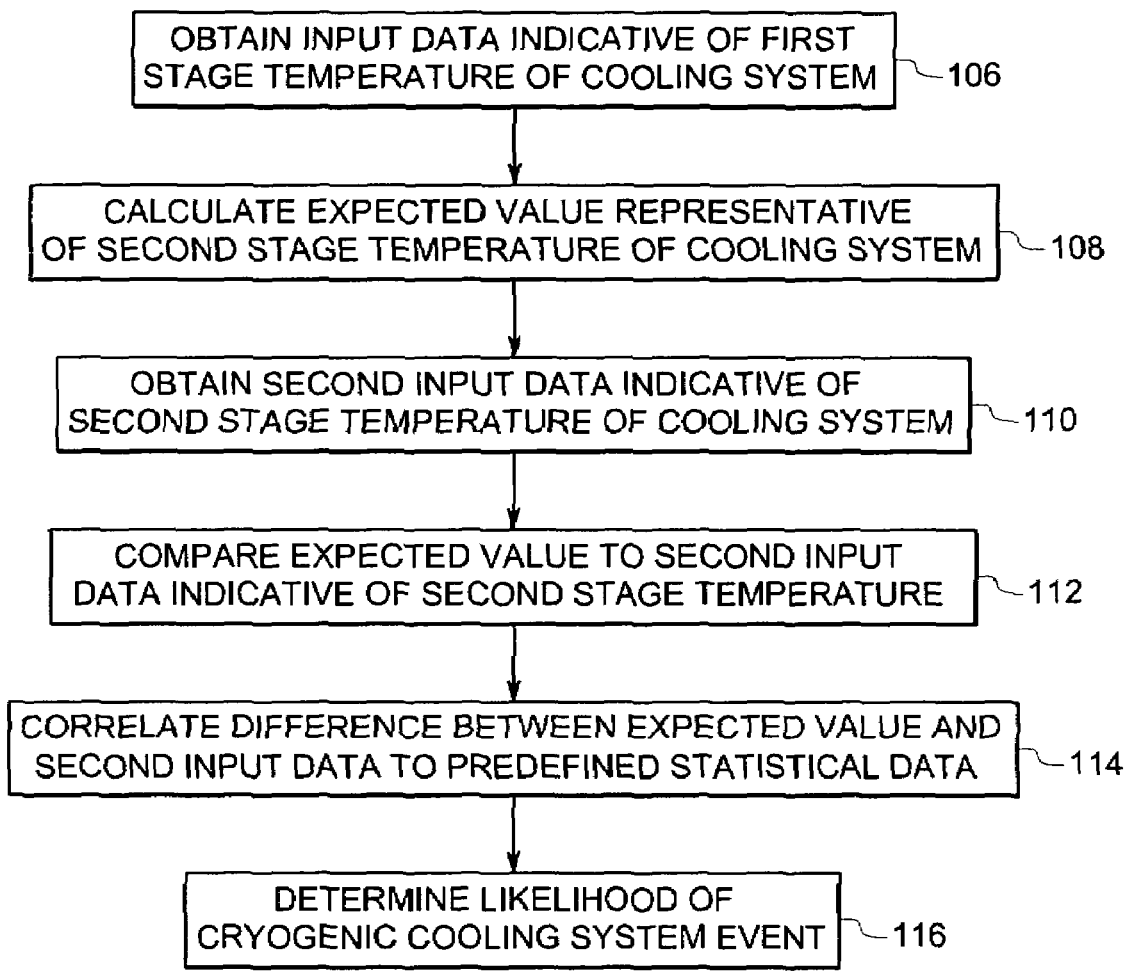
FIG. 6 is a flow chart illustrating an exemplary process of estimating a cryogenic cooling system event, in accordance with an exemplary embodiment of the present technique.

Referring to FIG. 6, a flow chart illustrating estimation of a cryogenic cooling system event is illustrated. An input data indicative of a first stage temperature of the cryogenic medium is obtained as represented by step 106. In the illustrated embodiment, first stage temperature of the cryogenic medium in the cold head is obtained via the sensor 68. The temperature data is transmitted to the monitoring circuitry 24. An expected value indicative of a second stage temperature of the cryogenic medium is calculated as represented by step 108. The algorithm 72 is configured to calculate the expected value indicative of the second temperature of the cryogenic medium based on a predefined thermodynamic relationship. For example, the algorithm 72 may be used on the Gifford-McMahon principle discussed above. A second input data indicative of the second stage temperature of the cryogenic medium is obtained via the sensor 68 as represented by step 110. The monitoring circuitry 24 is configured to compare the expected value to second input data indicative of second stage temperature of the cryogenic medium as represented by step 112. Thus, by comparing expected values with actual data, operating conditions of the device can be predicted, as discussed further below.

The difference between the expected value and the second input data indicative of second stage temperature is correlated to predefined statistical data as illustrated by step 114. The correlation is used to determine the likelihood of cryogenic cooling system event as illustrated by step 116. In one embodiment, the cryogenic cooling system event may be related to cold head failure. In another embodiment, the cryogenic cooling system event may be related to compressor failure. Similarly in other embodiments, the cryogenic cooling system event may be related to any other conditions related to the functioning of the cooling system. Although in the illustrated embodiment, temperature is monitored to determine the cryogenic cooling system event, other parameters such as pressure of the cryogenic medium may also be monitored to determine the cryogenic cooling system event.

Figure 7:
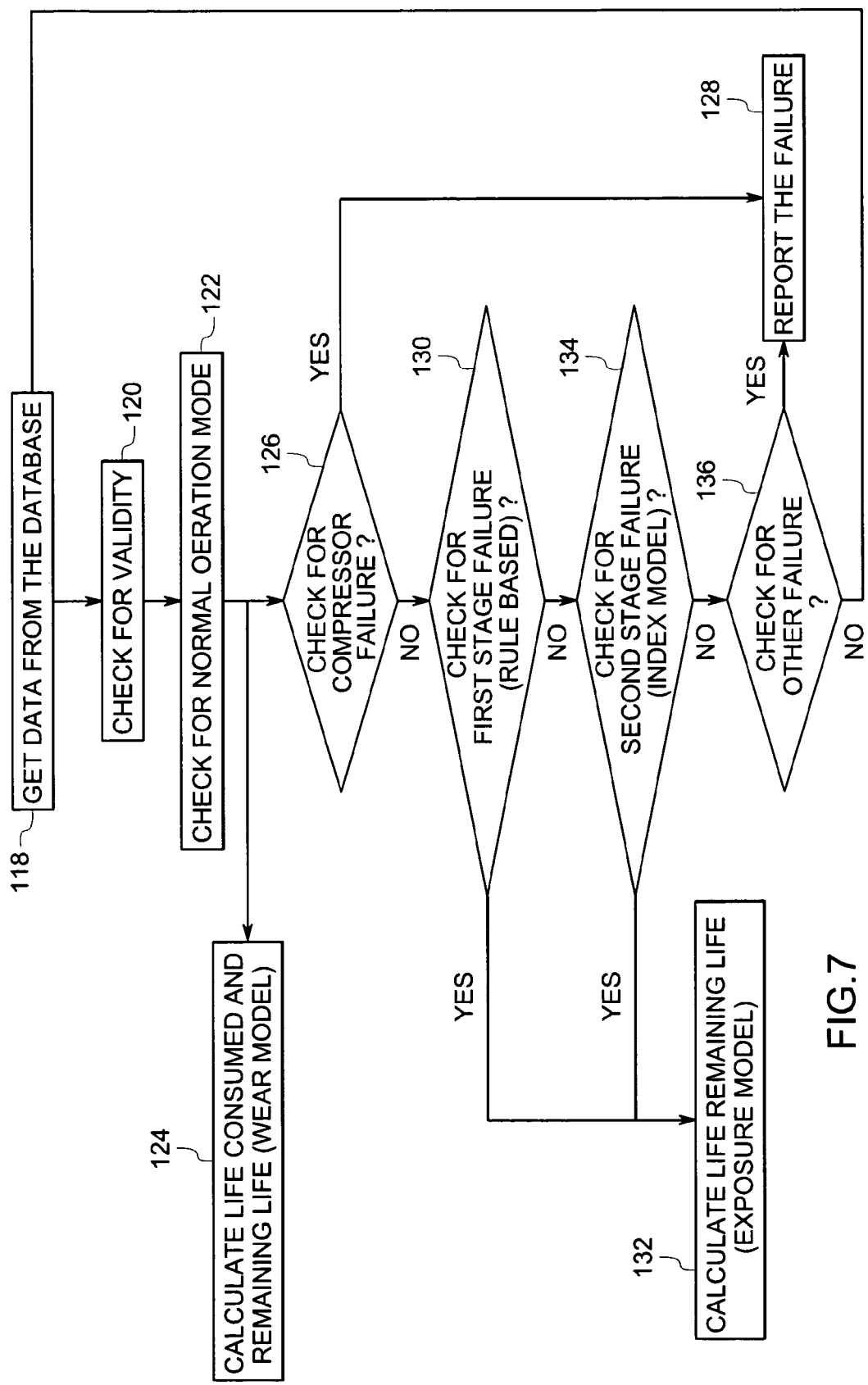
FIG. 7 is a flow chart illustrating an exemplary process of estimating a cryogenic cooling system failure, in accordance with an exemplary embodiment of the present technique.

Referring generally to FIG. 7, flow chart representing steps involved in estimation of cryogenic cooling system failure is illustrated. Data stored in the database is retrieved as represented by step 118. The data may include vessel temperature, vessel pressure, heater duty cycle, coolant pressure, shield temperature, helium level, recondenser temperature, water flow, water temperature, cold head temperature, or the like. As known to those skilled in the art, the data may be checked for validity as represented by step 120. The cooling system is checked to estimate whether it is operating in a normal operation mode based on a rule based model as represented by step 122. The rule based model determines the operating conditions of the cryogenic cooling system and also facilitates to distinguish between a normal operation mode and an abnormal operation mode of the cooling system. That is, the rule based model provides an indication of incipient failure based on the given cooling system operating outside of predefined operating parameters, which are discussed below.

In the illustrated embodiment, it is believed that if the vessel pressure is between 3.8 and 4.2 psi; the rate of change of the helium level over a given time period is between −0.1 and 0.1%/hour, or the rate of change over a give time period of shield temperature is less than 3 Kelvin/hour, and heater duty cycle is not zero, then it is assumed that the cooling system is operating in normal operation mode and that incipient failure is not a concern.

Whether normal operating conditions are or are not detected, the exemplary method calculates the life consumed and remaining life of the cold head based on a seal wear model, as represented by step 124. That is, the remaining life of the cold head is estimated based on the remaining life of sealing components within the cooling system. The computational operations based on seal wear model are as follows. The mode of shield temperature is estimated at which second stage temperature of the cold head is 4 Kelvin. Seal wear or degradation is calculated in accordance with the following relations:

$$\text{consumed life(in } hrs) = \text{wear rate} \times \text{elasped time}$$

$$\text{remaining life(in } hrs) = \frac{10000 - \text{consumed life}}{\text{ideal wear rate}}$$

$$\text{remaining life(in } hrs) = \frac{10000 - \text{consumed life}}{\text{current wear rate}}$$

where, the ideal wear rate and current wear rate are calculated and determined in view of gathered statistical data correlating seal failure and operating parameters of the cooling device. Also, it is worth noting that the cold head life is assumed to be 10,000 hours.

If the cooling system is estimated to be operating at normal operation mode as discussed above, the compressor failure is checked in accordance with further aspects of the rule based model as represented by step 126. In the exemplary embodiment, it is believed that the following parameters indicate incipient failure of the compressor: The rate of change in the shield temperature over a given time period has a value greater than 4 Kelvin/hour; the cold head second stage temperature is greater than 0.4 Kelvin; or the change in re-condenser temperature over a given period of time is greater than 0.3 Kelvin/hour. If the compressor failure is estimated, then this indication of incipient failure is reported to the operator, as illustrated by step 128. The operator may initiate necessary corrective action to prevent break down of the cooling system.

If the compressor failure is not estimated, then likelihood of first stage failure of the cold head may be estimated in accordance with aspects of the rule based model, as represented by step 130. In the exemplary embodiment, it is believed that the following parameters indicate first stage failure of the cold head. The rate of change of heater duty cycle over a given time period is less than zero; rate of change of vessel pressure over a given time period is 0.03 psi/hour; change in the helium level over a given time period is less than zero; shield temperature over a given time period is greater than 47 Kelvin; or the vessel pressure over a given period of time is greater than 4.5 psi.

In another embodiment, incipent failure of first stage of the cold head is estimated based on an index model. The index model receives actual sensor data for first and second stage temperature and estimates the thermodynamic temperature based on predefined thermodynamic relationships. For example, the index model monitors specific patterns in the temperature data and determines any abnormality, which might lead to cold head failure. In the illustrated embodiment, the index model calculates a cumulative of rolling standard deviations of actual field shield temperature from a predetermined ideal value that is based on gathered statistical data. If the difference between the current value and the previous value of the shield temperature exceeds a statistically determined threshold value, then the exemplary index model indicates that first stage failure is likely.

If the cold head first stage failure is indicated likely, either by the index model or the rule based model, remaining life of cold head is estimated based on an exposure model as represented by step 132. The exemplary exposure model estimates cumulative exposure of the cold head to conditions beyond its design conditions and estimates remaining life of the cold head.

The remaining life, in hours, of the cold head estimated based on the exposure model is calculated as follows. Cumulative difference of vessel pressure and shield temperature from expected pressure and temperature values is calculated. In one embodiment, ideal pressure is 4.1 psi and ideal temperature is 42 Kelvin. The rate of change (i.e. slope) of the vessel pressure and shield temperature data is calculated for a given time period, after an indication of failure by the index or rule based model. The remaining life of the cold head is calculated in accordance with the following relation:

$$\text{remaining life} = \frac{C - \text{cumulative difference}}{\text{slope}}$$

where C is a constant determined empirically from data

If the first stage failure of the cold head is not detected, a second stage failure of the cold head is estimated based on the above mentioned index model, as represented by step 134. In the illustrated embodiment, the cold head second stage temperature is multiplied by a predetermined value. The index model calculates a cumulative of rolling standard deviations of the calculated temperature from a predetermined ideal value that is based on gathered statistical data. If the difference between the current value and the previous value of the calculated temperature exceeds a statistically determined threshold value, then the exemplary index model indicates second stage failure is likely.

If the cold head second stage failure is indicated likely, based on the index model, remaining life of the cold head is estimated based on the exposure model as mentioned above. If the second stage failure is not detected, any other failures related to the scanner 12 may be determined as represented by step 136. The cycle is repeated.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method of estimating a cryogenic cooling system event, comprising:
   obtaining input data representative of a first parameter of a cryogenic medium in the cryogenic cooling system, wherein the first parameter is representative of a first stage of the cryogenic medium;
   calculating an expected value representative of a second parameter of the cryogenic medium in the cooling system via a predefined physics based model, wherein the second parameter is representative of a second stage of the cryogenic medium;
   obtaining second input data representative of the second parameter of the cryogenic medium in the cooling system; and
   comparing the expected value to the second input data; and
   correlating a difference between the expected value and the second input data to statistical data to estimate a likelihood of the cryogenic cooling system event.

2. The method of claim 1, wherein estimating a likelihood of the cryogenic cooling system event comprises estimating an interval of time corresponding to a time until a predicted occurrence of the cryogenic cooling system event.

3. The method of claim 2, wherein estimating the likelihood of the cryogenic cooling system event comprises detecting the failure of a cold head.

4. The method of claim 3, wherein detecting the failure of the cold head comprises determining the time-to-failure of the cold head based on seal wear rate.

5. The method of claim 1, wherein obtaining input data representative of the first parameter of the cryogenic medium comprises obtaining input data representative of a first stage temperature of the cryogenic medium.

6. The method of claim 1, wherein calculating the expected value representative of the second parameter of the cryogenic medium comprises calculating the expected value representative of a second stage temperature of the cryogenic medium.

7. The method of claim 6, wherein the predefined physics based model comprises a predefined thermodynamic relationship.

8. The method of claim 7, wherein comparing the expected value to the second input data comprises comparing the expected value representative of the second stage temperature of the cryogenic medium to the second input data representative of the second stage temperature of the cryogenic medium.

9. A computer program to enable a monitoring circuitry to perform estimation of a cryogenic cooling system event, the computer program comprising:
   programming instructions stored in a tangible medium that enable the monitoring circuitry to obtain input data representative of a first parameter of a cryogenic medium in a cryogenic cooling system, wherein the first parameter is representative of a first stage of the cryogenic medium;
   programming instructions stored in a tangible medium that enable the monitoring circuitry to calculate an expected value representative of a second parameter of the cryogenic medium in the cooling system via a predefined physics based model; wherein the second parameter is representative of a second stage of the cryogenic medium
   programming instructions stored in a tangible medium that enable the monitoring circuitry to obtain second input data representative of the second parameter of the cryogenic medium in the cooling system;
   programming instructions stored in a tangible medium that enable the monitoring circuitry to compare the expected value to the second input data; and
   programming instructions stored in a tangible medium that enable the monitoring circuitry to correlate a difference between the expected value and the second input data to statistical data to estimate a likelihood of the cryogenic cooling system event.

10. The computer program of claim 9, further comprising routine for determining time-to-failure of the cooling system based on seal wear rate.

11. A failure detection system for a cryogenic cooling system, comprising:

a first sensor configured to detect a value representative of a first parameter of a cryogenic medium in the cryogenic cooling system, wherein the first parameter is representative of a first stage of the cryogenic medium;

a second sensor configured to detect a value representative of a second parameter of the cryogenic medium in the cryogenic cooling system, wherein the second parameter is representative of a second stage of the cryogenic medium; and a monitoring circuitry configured to calculate an expected value representative of the second parameter of the cryogenic medium in the cooling system using a predefined physics based relationship;

wherein a difference between the expected value and the actual value representative of the second parameter is correlated to a predetermined statistical data to determine a likelihood of failure and time-to-failure of the cooling system.

12. The failure detection system of claim 11, further comprising an intermediate database configured to store values output from the first and second sensors.

13. The failure detection system of claim 11, wherein the monitoring circuitry is configured to compare the expected value representative of a second stage temperature of the cryogenic medium to the actual value representative of the second stage temperature of the cryogenic medium.

14. The failure detection system of claim 13, wherein the monitoring circuitry comprises a central database configured to store values output from the first and second sensors.

15. The failure detection system of claim 14, wherein the monitoring circuitry further comprises an algorithm configured to calculate the expected value representative of the second stage temperature of the cryogenic medium in the cooling system using a predefined thermodynamic relationship.

16. The failure detection system of claim 15, wherein the algorithm is further configured to correlate the difference between the expected value and the actual value representative of the second stage temperature to a predetermined statistical data to determine a likelihood of failure and time-to-failure of the cooling system.

* * * * *